Figure 1:
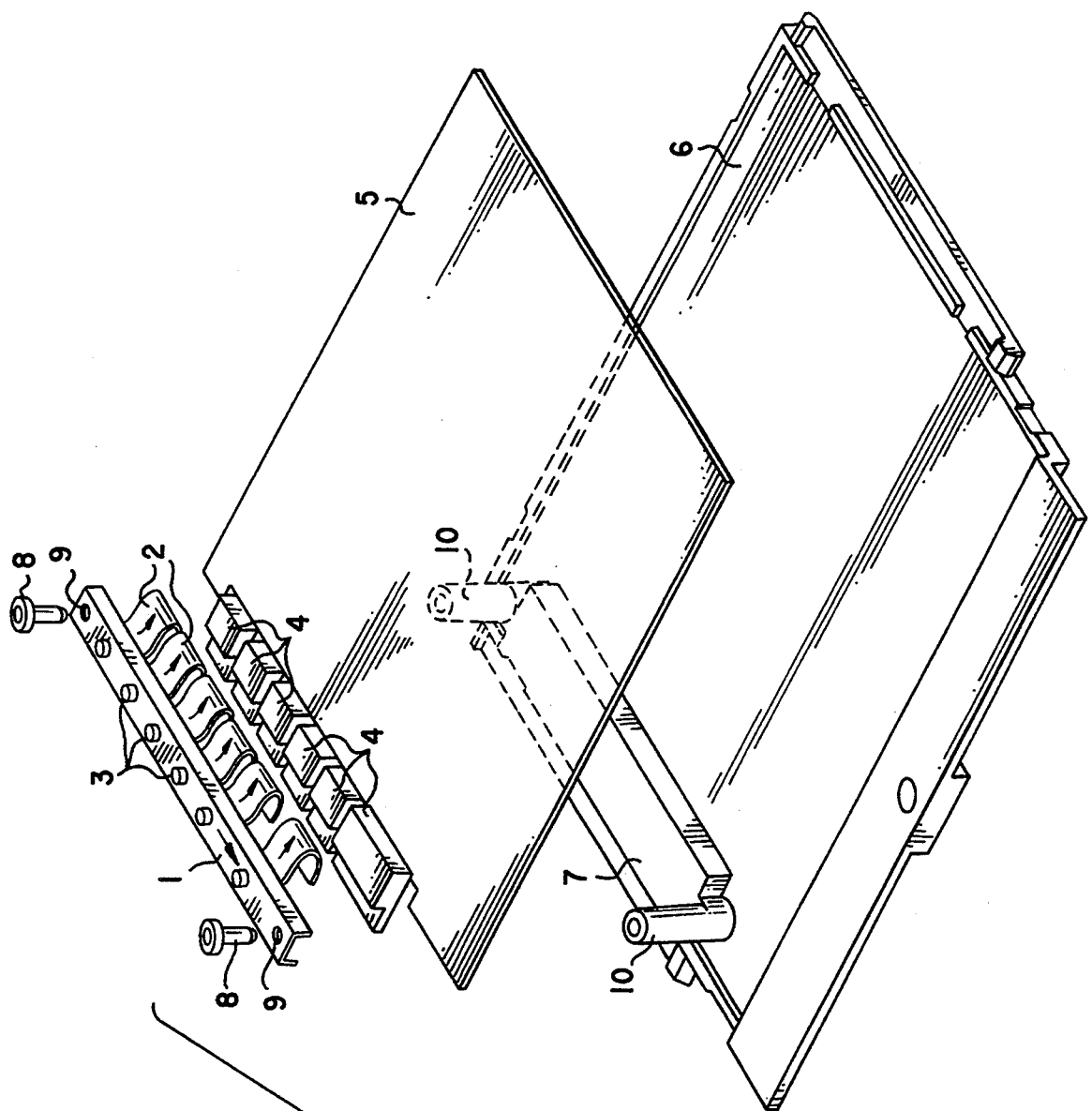

United States Patent [19]

Jurek

[11] Patent Number: 5,344,113
[45] Date of Patent: Sep. 6, 1994

[54] MULTIPLE SPRING-RETENTION DEVICE AND METHOD FOR MANUFACTURING IT

[75] Inventor: Gilles Jurek, Plaisance-du-Touch, France

[73] Assignee: Siemens Aktiengesellschaft, Munich, Fed. Rep. of Germany

[21] Appl. No.: 952,870

[22] PCT Filed: Jun. 21, 1991

[86] PCT No.: PCT/EP91/01148
  § 371 Date: Nov. 19, 1992
  § 102(e) Date: Nov. 19, 1992

[87] PCT Pub. No.: WO91/19420
  PCT Pub. Date: Dec. 26, 1991

[30] Foreign Application Priority Data

Jun. 21, 1990 [FR] France .................. 90 07760

[51] Int. Cl.⁵ .................................. A47G 1/10
[52] U.S. Cl. .................. 248/316.7; 361/707; 361/708
[58] Field of Search ............. 248/316.7; 361/708, 361/707, 771, 712; 174/16.3

[56] References Cited

U.S. PATENT DOCUMENTS

| | | | |
|---|---|---|---|
| 3,766,440 | 10/1973 | Baird | 361/708 |
| 3,992,653 | 11/1976 | Richardson | 361/707 |
| 4,669,028 | 5/1987 | Faa | 174/16.3 X |
| 4,674,005 | 6/1987 | Lacz | 361/388 |
| 4,688,150 | 8/1987 | Peterson | 361/771 |
| 4,689,719 | 8/1987 | Prussas et al. | |
| 4,803,545 | 2/1989 | Birkle | 174/16.3 X |
| 4,855,867 | 8/1989 | Gazdik | 361/708 |
| 4,961,125 | 10/1990 | Jordan | 361/707 |
| 5,138,524 | 8/1992 | Smithers | 174/16.3 X |
| 5,237,485 | 8/1993 | Martiis | 361/712 |

FOREIGN PATENT DOCUMENTS

| | | |
|---|---|---|
| 0048938 | 4/1982 | European Pat. Off. |
| 0195701 | 9/1986 | European Pat. Off. |
| 0086752 | 5/1983 | Japan ................ 174/16.3 |
| 8904593 | 5/1989 | PCT Int'l Appl. |

*Primary Examiner*—J. Franklin Foss

[57] ABSTRACT

The device comprises a small connecting bar (1) and a plurality of elastic tabs (2) fastened at (3) on the small bar. Screws 8 fasten the device onto the base (6) of a housing which receives an electronic circuit board (5) associated with electronic power components (4). The tabs (2) squeeze the components (4) against a radiator (7). The device has a modular nature permitting the production of a family of devices of this type adapted to varied distributions of components (4).

Application to the cooling of electronic power components in a command housing of automobile electronics.

15 Claims, 2 Drawing Sheets

MULTIPLE SPRING-RETENTION DEVICE AND METHOD FOR MANUFACTURING IT

The present invention relates to a multiple spring-retention device designed to fasten a plurality of aligned components onto a support, by means of elastic loading of these components against this support. More particularly, the invention relates to a device of this type which is adapted to fastening electronic components on a support forming a thermal radiator, with a view to cooling these components. The present invention also aims to provide a method for producing a device of this type.

Nowadays, an electronic power component is commonly fastened onto a radiator with the aid of a spring produced by cutting out and folding "spring" sheet steel. In certain electronic housings comprising several aligned power components, for example on an edge of an electronic circuit support, the fastening of these components onto a common radiator with the aid of individual springs is costly in terms of manpower. Thus, for mass production, "multiple" retention devices have been designed, which, in an adapted monoblock form, combine several springs or elastic tabs which simultaneously squeeze all the components after a single, and thus economical, assembly of the device in the housing. A multiple "clip" or device of this type, acting by pinching between two rows of elastic tabs, is disclosed in European Patent No. 0,195,701, granted to BENDIX ELECTRONICS S.A.

Multiple devices of this type have been satisfactory but, nevertheless, have certain limitations. Their form is rigid and adapted to only one configuration of aligned components. Their production by means of cutting out and folding sheet metal leads to the wastage of scraps of sheet metal of up to, for example, 30% of the surface of the blanks used, which is uneconomical. A longer multiple device requires the use of a more powerful cutting press, the more so as it is then often necessary to use harder stainless steel in order to prevent major deformations during the heat treatment which is necessary to obtain a spring steel.

Moreover, the device may comprise only one single row of elastic tabs and a small bar connecting these tabs cut out simultaneously, in a single operation, the tabs generally being oriented perpendicularly to the axis of the small bar. As the sheet metal used has undergone a rolling treatment, the tabs can be provided with good elasticity by cutting them out in the direction of the rolling treatment. At the same time, the small connection bar is oriented perpendicularly to this rolling-treatment direction, which lowers its resistance to the bending stresses to which it is subjected in reaction to the pressures applied by the tabs on the components to be fastened. The rigidity of the small bar may then be insufficient and it becomes deformed. This drawback may be alleviated by using a thicker sheet metal, a solution which results in an increase in the cost of the device and the resistance to bending of the elastic tabs. If the orientations of the elastic tabs and of the small bar relative to the rolling-treatment direction are reversed, it is the tabs, on the contrary, which will have their resistance to bending reduced.

Moreover, a requirement has arisen for a method for manufacturing retention devices of this type, making it possible to produce devices of a "modular" nature, in order simply and economically to manufacture a family of devices of this type which are adaptable to any arrangement of electronic components to be fastened onto a radiator. Thus, for example, in automobile electronics, the various versions of one and the same fuel-injection computer may, according to the functions implemented in this computer, have a greater or smaller number of power components arranged in various configurations and even, if appropriate, with various spacings, on an edge of an electronic board of this computer. The known methods for producing multiple spring-retention devices then result in different manufacturing processes, with as many cutting-out and folding tools as there are different versions of the computer. This manner of proceeding is expensive and ill-adapted to mass production on a tight budget, such as occurs in automobile electronics.

The present invention thus aims to produce a multiple spring-retention device and to provide a method for producing this device which does not have the above-mentioned drawbacks of the known multiple retention devices of the prior art.

In particular, the present invention aims to produce a device of this type which is modular, permitting the manufacture of a family of different devices using the same manufacturing tools and the same basic elements.

The present invention also aims to produce a device of this type in which all its parts have optimum resistance to bending stresses.

These aims of the invention are achieved, together with others which will become apparent in the remainder of the present description, with a multiple spring-retention device of the type which comprises a plurality of aligned elastic tabs each designed to squeeze a component forming part of a plurality of aligned components against a support. According to the invention, this device consists of a small connecting bar and of elastic tabs formed individually and fastened in a line onto the small bar by individual fastening means for each tab.

By thus renouncing the "integral" character of the retention devices of the prior art, it is possible to cut out the small bar and the tabs in the direction of the rolling treatment of sheet metal in order to benefit from optimum resistance to bending both for the small bar and for the tabs.

In order to manufacture a retention device of this type, on the one hand, a small connecting bar, and on the other hand, elastic tabs are produced according to the invention. Fastening positions capable of receiving, if appropriate, the tabs are defined on the small bar and the tabs are fastened onto the small bar in at least some of these positions, so as to form a device adapted to the retention of a plurality of components distributed according to the manner in which the tabs are fastened onto the small bar.

By virtue of this method, it is possible to produce a large variety of different retention devices using the same basic elements assembled in different configurations. The retention devices manufactured in this way using the same tools are thus perfectly adaptable, in an economic manner, to the various versions of one and the same electronic housing.

Figure 2A:
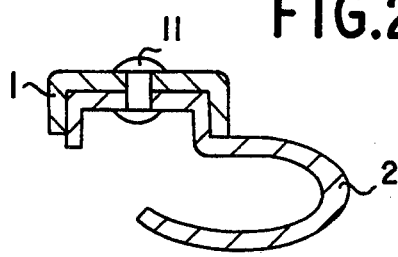
Figure 2B:
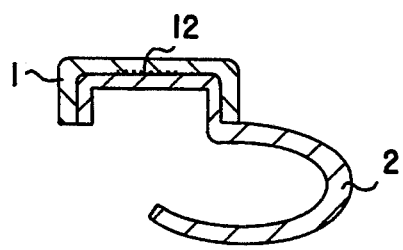
Figure 2C:
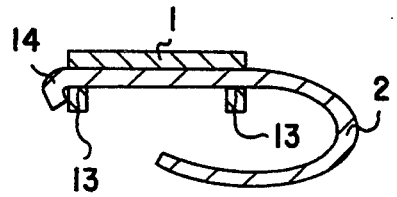
Figure 2D:
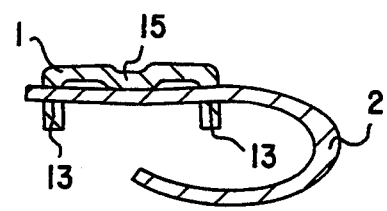
Figure 2E:
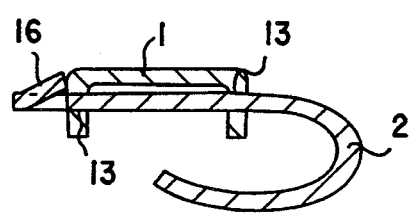
Figure 3:
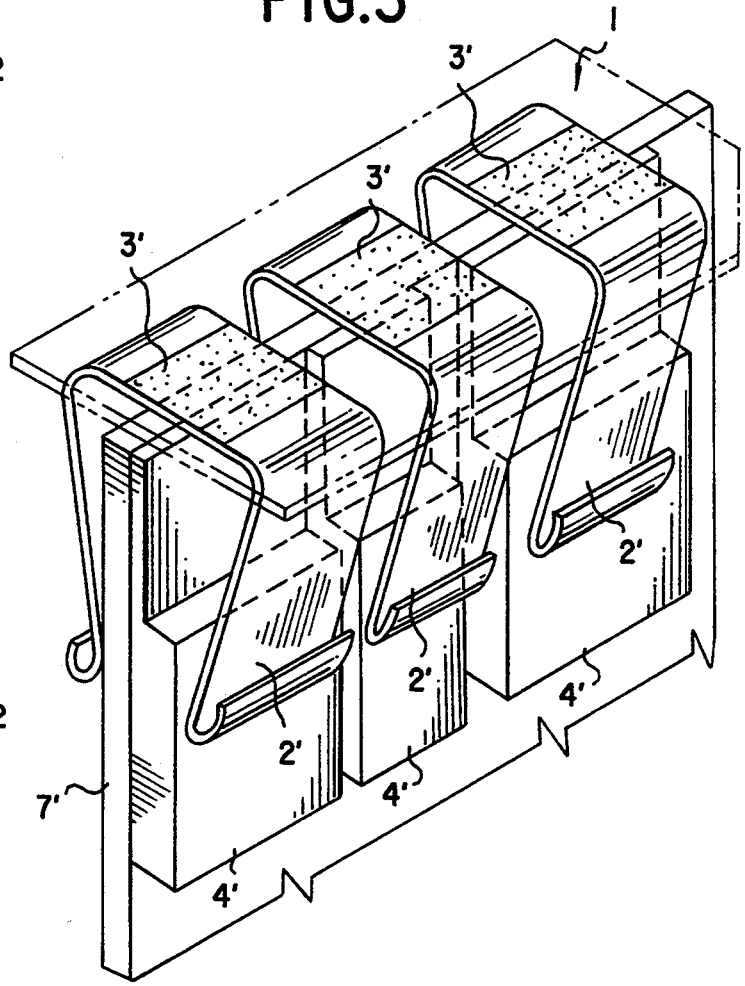

Further features and advantages of the present invention will become apparent on reading the following description and on examining the appended drawing, in which:

FIG. 1 is an exploded view of a part of an electronic housing equipped with a multiple spring-retention device according to the invention, FIGS. 2a to 2e show various means of fastening elastic tabs onto a small connecting bar, forming part of a multiple retention device according to the invention, and, FIG. 3 shows a further embodiment of a multiple retention device according to the invention.

Reference is made to FIG. 1 which shows, in perspective, a multiple spring-retention device according to the invention, consisting essentially of a small connecting bar 1 and of a plurality of elastic tabs 2 aligned according to the longitudinal axis of the small bar and assembled on the latter by individual fastening means 3. As shown, each of the tabs 2 is folded in order to have a longitudinal U-shaped profile, the free end of each tab being shaped in order to bear on electronic components 4 arranged in a line. These components are, for example, electronic power components under housings of all types and, in particular, of the TO type as shown in the drawing. Components of this type are found arranged in this manner in fuel-injection and/or ignition control electronic housings, for example in association with internal-combustion engines. A housing of this type serves to protect one or more electronic boards 5 fastened on a base 6 of the housing. For the purposes of clarity in the figure, the other parts of the housing, cover, belt or hood, which conventionally complete a housing of this type, have not been shown. A thermal radiator 7 is formed in a single piece with the base 6 or attached to the latter, and this radiator forms a support on which the power components 4 must be held in close contact, promoting a transfer of heat capable of cooling the components. These electronic components in fact command actuators outside the housing and thus control high-intensity currents which generate considerable heat dissipation in the components.

The essential role of the multiple spring-retention device is to provide a close contact, under elastic load, between each component and the radiator 7. A device of this type is mounted on the base 6 by virtue of fastening means, such as screws 8 passing into holes 9 pierced at the two ends of the small bar 1 in order to be anchored in distance sleeves 10 projecting from the base 6. The geometry of the tabs 2 is such that, after fastening the device onto the base 6, each tab bears elastically on the upper face (from the standpoint of the figure) of the housing of each component 4 so as to squeeze the lower face of the said housing against the radiator 7.

The preceding description of the device according to the invention makes it possible to reveal various advantageous features of this device.

Firstly, it appears that a multiple retention device according to the invention maybe produced virtually without wastage of materials. This is an advantage over known devices of the prior art, in which tabs and small connecting bar form only one piece: separating the tabs by cutting out the material located between them results in scraps of waste material. On the other hand, the tabs of the device according to the invention may be cut out contiguously, without scrap.

The tabs cut out in this manner can be fastened onto a small connecting bar in a wide variety of configurations, each adapted to the number of configurations of aligned components 4 to be squeezed against a radiator. Thus, if one or more of the components 4 shown in FIG. 1 is absent, the invention makes it possible to produce a retention device which does not have the corresponding tabs which are, in this case, not used, a solution which is particularly economical. Similarly, the spacing of the distribution of the tabs may be modified. In practice, the method for manufacturing the retention device according to the invention then consists in producing, on the one hand, a small connecting bar and, on the other hand, elastic tabs. The pieces produced in this way feed an assembly machine which may be equipped with means making it possible to programme the fastening points of the tabs on the small bar, as well as their spacing. As shown in FIG. 1, programming may also permit the definition of gaps between tabs which are different between two adjacent pairs of tabs (see the gap separating the two tabs located furthest to the left from the standpoint of the figure), in order to adapt the device to components of different dimensions, for example.

Thus, the invention makes it possible to produce retention devices with very varied configurations using a single cutting-out and assembly tool, by virtue of the modular nature of the device according to the invention. As the elastic tabs to be produced are of smaller dimensions than those of retention devices incorporating a plurality of tabs of this type, it will be possible to use less powerful cutting-out machines to produce the tabs of the device according to the invention.

Two other important advantages are drawn from the modular nature of the device according to the invention.

Because the elastic tabs and the small bar can be cut out from sheet metal of different thicknesses, it will be possible to use thick sheet metal for the small bar, giving this small bar satisfactory rigidity, and, a thinner sheet metal, with a high elastic limit, for the tabs, giving the tabs greater flexibility, for example.

Moreover, it is known that the flexural strength of rolled products is greater when the bending stress is exerted in a plane parallel to the direction of the rolling treatment than when this stress is exerted in a plane perpendicular to this direction. As the general directions of the small bar and of the tabs are generally perpendicular, in a multiple retention device of the prior art, formed from one piece, it is not possible to align both the axis of the small bar and the median axis of the tabs with the direction of the rolling treatment of the sheet metal from which it is cut out. Thus, if the axis of the small bar and the direction of the rolling treatment are aligned, the small bar will have the required strength, but the tabs may then lack this, being folded perpendicularly to the direction giving optimum strength. If the tabs and the direction of the rolling treatment are aligned, it is, on the contrary, the small connecting bar which may lack strength and not withstand the reaction forces it has to bear due to the pressure developed by the tabs on the components 4.

By cutting the small bar and the tabs out separately, according to the invention, so that their axes are parallel to the direction of the rolling treatment (indicated by arrows in FIG. 1), these pieces are given optimum mechanical strength, which it is impossible to obtain with the multiple devices of the prior art which are cut in a single operation from one and the same blank. This constitutes an essential advantage of the multiple retention device according to the invention, which makes it possible to optimise production thereof.

FIGS. 2a to 2e illustrate various assembly techniques making it possible to fasten the elastic tabs onto the small connecting bar of the multiple retention device according to the invention. These figures are sections through this device, through the median plane of one of the tabs. In FIG. 2a, the elastic tab 2 is fastened onto the small bar i by means of a rivet 11. In FIG. 2b, the tab is fastened onto the small bar by means of an electric weld 12, by means of resistance spot welding or seam welding for example. In FIG. 2c, the tab 2 passes through two apertures 13 pierced in the flanges of the small bar 1 and it is fastened onto the latter by forming a nose 14 at the end which has passed through the two apertures 13. The nose 14 may be replaced by a deformation 15 of the small bar which wedges the tab 2 which has previously been slipped through the apertures 13 (see FIG. 2d). It is also possible to assemble the tab 2 and the small bar 1, after passage through the apertures 13, by virtue of an elastic snap-connection tab 16 (FIG. 2e).

The assembly means shown in FIGS. 2a to 2e are given only by way of example and a person skilled in the art will be able to replace them with any of the very large number of other assembly means which are well known in the art.

FIG. 3 shows, in perspective, a further embodiment of a multiple retention device according to the invention, which operates by pinching the components and the radiator onto which these components have to be fastened, Just like "the clip" which is the subject of the abovementioned patent. This clip is, however, formed in one piece, whereas the alternative embodiment of the multiple retention device according to the invention, shown in FIG. 3, applies the concept of modular construction illustrated in connection with FIG. 1. Thus, this device comprises a small bar 1', which may, for example, be flat (shown transparent in FIG. 3 for purposes of clarity in the drawing), and a plurality of double tabs 2' capable of pinching together a component 4' and the radiator 7'. Here, also, the piece 1' and the tabs 2' may be cut out parallel to the rolling-treatment direction of the sheet metal used. Welds 3', for example, fasten the tabs 2' onto the small bar 1'. Just as in the case of the embodiment described in connection with FIG. 1, it is possible to produce a family of devices generally in accordance with that shown in FIG. 3 by varying the number of tabs 2', their presence or their absence in certain predetermined fastening positions, the spacing or the gap separating them, etc.

It has been seen above that, in a multiple spring-retention device according to the invention, it is possible to use sheet metal of different thicknesses for the small connecting bar and for the elastic tabs. It is also possible for these elements to be formed from different materials, for economic reasons for example. Thus, the elastic tabs, which are pieces of small size unsuitable for major deformations during the heat treatment of a spring steel, may consist of a steel which is a type less expensive than a stainless steel. The latter is, on the other hand, necessary in order to produce a multiple retention device in a single piece according to the prior art, in order to avoid excessively great deformations of the connecting part of the tabs. Moreover, the small connecting bar of the device according to the invention may be produced from various materials according to the amount of mechanical stresses undergone: spring steel, mild steel, aluminium, even plastic material, in particular in the case of a device of the type shown in FIG. 3 which does not have to withstand great reaction forces to the compression forces applied to the components, unlike that in FIG. 1.

It now appears that the features of the device according to the invention permit inexpensive manufacture, as is particularly sought-after in mass production of automobile electronics. The invention makes it possible to reduce the global investment required in order to produce a family of devices of this type, by virtue of a reduction of the number of tools required, the simplicity of these tools and the capacity of the device to be adapted to neighbouring geometries. The invention thus makes it possible to reduce the unit price of the spring by reducing cut-out scrap, simplifying the manufacture of the pieces, optimising the number of elastic tabs for each element in the family and using economical raw materials.

I claim:

1. A modular spring-retention device, comprising:
   a support,
   a plurality of mutually aligned elastic tab means cooperating with said support for clamping a plurality of mutually aligned components between respective ones of said tabs and said support,
   a connecting bar interconnecting said elastic tabs, said bar being formed separately from said support and said bar and said tabs being formed individually and separately, and
   a plurality of fastening means for individually fastening each of said tabs to said connecting bar in a predetermined position corresponding to respective individual positions of said components.

2. Device according to claim 1, including attachment means disposed on said connecting bar for attaching said connecting bar to said support such that said tabs clamp the components against said support.

3. Device according to claims 1, wherein said tabs include a U-shaped folded elastic part.

4. Device according to claims 1, wherein said tabs are double folded tabs clamping therebetween respective ones of the components and said support.

5. Device according to claim 1, wherein said connecting bar and said tabs are formed from blanks of respectively different thickness.

6. Device according to claim 1, wherein said support has a given thickness and said tabs are formed by cutting out and folding blanks having a thickness different from said given thickness.

7. Device according to claim 1, wherein said tabs are formed of a material having undergone a rolling treatment.

8. Device according to claim 1, wherein said connecting bar is formed from blank material having undergone a rolling treatment with a given rolling direction, said connecting bar having a longitudinal axis being parallel to said given rolling direction of said blank material.

9. Device according to claim 1, wherein said elastic tabs are formed of blank tab material having undergone a rolling treatment with a given tab rolling direction, said tabs having a center axis being parallel to said given tab rolling direction of said blank tab material.

10. Device according to claim 1, wherein said means for fastening said tabs to said connecting bar are one or more of rivetting means, electric welding means, deformation of one of the assembled components, mechanical wedging and snap-fastening.

11. The device according to claim 1, wherein said tabs are formed of a metal having a relatively high elastic limit.

12. Method of manufacturing a multiple spring retention device, comprising:
   forming a connecting bar having a longitudinal axis,
   producing a plurality of elastic tabs, defining receiving and fastening locations for the elastic tabs on the connecting bar, fastening a plurality of the tabs to the connecting bar in at least some of the defined locations and forming a device for individually clamping a plurality of aligned components onto a support.

13. The method according to claim 12, which comprises defining the receiving and fastening locations by spacing the locations along the connecting bar in accordance with the spacing of the aligned components to be clamped on the support.

14. The method according to claim 12, which comprises, prior to the forming step, subjecting blank material to a rolling treatment with a given rolling direction and forming the connecting bar with its longitudinal axis parallel to the given rolling direction of the blank material; and, prior to the producing step, subjecting blank tab material to a rolling treatment with a given tab rolling direction, and producing the tabs with a center axis being parallel to the given tab rolling direction of the blank tab material.

15. The method according to claim 12, which comprises fastening the elastic tabs to the connecting bar with one or more of rivetting process, electric welding process, deformation process of one of the assembled components, mechanical wedging process and snap-fastening process.

* * * * *